United States Patent
Yamazaki et al.

[11] Patent Number: 6,074,900
[45] Date of Patent: *Jun. 13, 2000

[54] METHOD FOR PRODUCING SEMICONDUCTOR DEVICE

[75] Inventors: Shunpei Yamazaki, Tokyo; Yasuhiko Takemura, Kanagawa, both of Japan

[73] Assignee: Semiconductor Energy Laboratory Co., Ltd., Kangawa-ken, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/805,937

[22] Filed: Feb. 25, 1997

Related U.S. Application Data

[62] Division of application No. 08/556,089, Nov. 9, 1995, abandoned.

[30] Foreign Application Priority Data

Nov. 11, 1994 [JP] Japan ................................ 6-303167

[51] Int. Cl.[7] .................................................. H01L 21/84
[52] U.S. Cl. ...................... 438/164; 438/302; 438/525; 438/592
[58] Field of Search ................................. 438/151, 308, 438/592, 302, 525, 164

[56] References Cited

U.S. PATENT DOCUMENTS

| | | | |
|---|---|---|---|
| 5,202,277 | 4/1993 | Kameyama et al. | 438/302 |
| 5,393,687 | 2/1995 | Liang | 438/532 |
| 5,403,759 | 4/1995 | Havemann | 437/40 |
| 5,407,837 | 4/1995 | Eklund | 437/21 |
| 5,426,064 | 6/1995 | Zhang et al. | 437/40 |
| 5,459,090 | 10/1995 | Yamazaki et al. . | |
| 5,508,209 | 4/1996 | Zhang et al. | 437/21 |
| 5,545,571 | 8/1996 | Yamazaki et al. | 437/21 |

FOREIGN PATENT DOCUMENTS

| | | | |
|---|---|---|---|
| 3-203322 | 9/1991 | Japan | 437/41 |
| 5-152335 | 6/1993 | Japan | 437/41 |

OTHER PUBLICATIONS

Wolf et al., "Silicon Processing for the VLSI Era Vol. 1: Process Technology", Lattice Press, pp. 292–294, 1986.

*Primary Examiner*—Richard Booth
*Attorney, Agent, or Firm*—Eric J. Robinson; Nixon Peabody LLP

[57] ABSTRACT

In producing a top gate type or a bottom gate type thin film transistor (TFT), after a metal film for forming silicide is formed on a semiconductor active layer provided on an insulating surface, an N-type or P-type impurity ion is introduced into the semiconductor active layer using an anodizable gate electrode and an anodic oxide formed on the surface of the gate electrode as masks. The exposing portion of the semiconductor active layer is reacted with the metal film, so that a silicide layer is formed in the portion. Then, non-reacted portion of the metal film is removed.

17 Claims, 12 Drawing Sheets

METHOD FOR PRODUCING SEMICONDUCTOR DEVICE

This is a Division application of Ser. No. 08/556,089, filed Nov. 9, 1995 now abandoned.

BACKGROUND OF THE INVENTION

1. Field of the Invention

The present invention relates to an insulated gate transistor (TFT) formed on an insulating surface of, e.g., an insulating material such as glass or a material which an insulating film such as a silicon oxide is formed on a silicon wafer, and to a producing method therefor. The invention particularly suitable for a TFT formed on a glass substrate having a glass transition point (a strain temperature or a strain point) of 750° C. or lower. A semiconductor device of the invention is used in an active matrix of a liquid crystal display, a driving circuit of an image sensor, or a three dimensional integrated circuit.

2. Description of the Related Art

Conventionally, it is commonly known that TFTs (thin film transistors) are formed to drive an active matrix type liquid crystal display device, an image sensor, or the like. Recently, for high speed operation, the crystalline silicon TFT having a higher electric field mobility have been developed to replace the amorphous silicon TFT having an amorphous silicon active layer. Further, to realize high characteristics, there is required a structure in which to reduce the sheet resistance of the source and drain, they are formed with silicide as in the semiconductor integrated circuit manufacturing technology. As for the silicide structure, refer to H. Kaneko et al., IEEE Trans. Electron Devices, ED-33, 1702 (1986), for instance.

However, in contrast to the known semiconductor integrated circuit manufacturing technology, the TFT manufacturing technology still has many problems to be solved. In particular, there is a strong restriction that it cannot form a minute pattern, because devices are formed on an insulating surface and reactive ion anisotropic etching cannot be fully effected.

FIGS. 6A to 6G show presently used typical processes for producing a silicide structure. A base film 602 is formed on a substrate (glass substrate or silicon wafer) 601. An active layer 603 is formed thereon with crystalline silicon. An insulating film 604 is formed on the active layer 603 with a material such as silicon oxide. (FIG. 6A)

A gate electrode 605 is formed with polycrystalline silicon (doped with an impurity such as phosphorus), tantalum, titanium, aluminum, etc. Impurity regions 606 are formed in the active layer 603 by introducing an impurity element (phosphorus or boron) by ion doping or the like in a self-alignment using the gate electrode 605 as a mask. The region of the active layer 603 which is located under the gate electrode and into which the impurity is not introduced becomes a channel forming region. (FIG. 6B)

An insulating film 607 of silicon oxide or the like is formed by plasma chemical vapor deposition (plasma CVD) or atmospheric pressure CVD (APCVD). (FIG. 6C)

By anisotropically etching the film 607, side walls 608 are formed adjacent to the side surfaces of the gate electrode 605. (FIG. 6D)

A metal film 609 of titanium, chromium, tungsten, molybdenum, or the like is formed on the entire surface to form a silicide thereof. (FIG. 6E) Silicide regions 610 are formed by causing the metal film to react with the impurity regions 606. Since silicide is not formed in the portions (width: x) of the impurity regions 606 under the side walls 608, those portions become ordinary source and drain regions 611. (FIG. 6F)

After an insulating film 612 is formed, contact holes for the source and drain regions 611 are formed through the interlayer insulating film 612, and then wiring electrodes 613 connecting to the source and drain 611 are formed with a metal material such as aluminum. (FIG. 6G)

The above process uses the silicide forming process itself of the conventional semiconductor integrated circuit manufacturing technology, and therefore includes a step that is hard to apply to the process of producing TFTs on a glass substrate, and a step that is not favorable in productivity.

Firstly, the surface of the active layer needs to be etched after doping. It is known that a thinner active layer of a TFT provides better characteristic. Thus, in forming the side walls 608 in FIG. 6D, it is necessary to prevent overetching of the active layer 603. However, while a thickness of the active layer 603 should be 1,500 Å or less, more preferably 800 Å or less, the insulating film 607 for forming the side walls 608 should be approximately as thick as the gate electrode 605 and has 3,000 to 8,000 Å in thickness, so that overetching cannot be prevented. Also, the active layer 603 doped with an impurity (i.e., doped silicon) is etched easily in comparison with intrinsic silicon. Thus, under the ordinary conditions, in forming the side walls 608, the active layer 603 is greatly etched or cannot be etched with good reproducibility.

Secondly, it is difficult to form the side walls 608. The insulating film 607 is as thick as 0.5 to 2 μm. Since usually the thickness of the base film 602 formed on the substrate 601 is 1,000 to 3,000 Å, it frequently occurs that this etching is erroneously performed to etch the base film 602 to thereby expose the substrate 601. This results in a reduction of the yield. Particularly, since the glass substrate used to produce TFTs includes many elements that are harmful to a silicon semiconductor, the overetching needs to be prevented.

It is also difficult to form the side walls 608 with uniform widths. Because of the use of a substrate having an insulating surface, rather than a silicon substrate used in producing a semiconductor integrated circuit, it is difficult to finely control plasma during plasma dry etching such as reactive ion etching (RIE).

SUMMARY OF THE INVENTION

An object of the present invention is to solve the above problems and to provide a method for producing a silicide structure by a simplified process. In the invention, silicide is formed without using the side walls. That is, the fundamental concept of the invention is that doping for the source and drain regions is performed after a metal film for forming silicide is formed.

According to the invention, a semiconductor device producing method comprises the steps of: (A) forming a semiconductor active layer on an insulating surface, forming an insulating film on the semiconductor active layer, and forming a gate electrode material film on the insulating film using an anodizable material; (B) forming a gate electrode by selectively providing a mask film on the gate electrode material film and etching the gate electrode material film using the mask film; (C) forming a first porous anodic oxide mainly on a side surface of the gate electrode by supplying a current to the gate electrode in an electrolytic solution; (D) removing the mask film; (E) forming a second barrier type anodic oxide on top and side surfaces of the gate electrode by supplying a current to the gate electrode in an electrolytic solution; (F) exposing a surface of a portion of the semiconductor active layer by removing (etching) a portion of the insulating film using the first anodic oxide as a mask, and at the same time forming a gate insulating film; (G) selectively removing the first anodic oxide; (H) forming a silicide forming metal film to cover the gate electrode and the gate insulating film; (I) selectively introducing an N-type or P-type impurity element into the semiconductor active layer through the metal film by using the gate electrode and the gate insulating film as masks; (J) selectively forming a silicide region in the semiconductor active layer by causing the metal film to selectively react with the semiconductor active layer; and (K) removing a portion of the metal film that has not reacted in step (J).

Among the above steps, while the order of steps (A) to (H) cannot be changed, the order of steps (I) to (K) can be changed. The following two processes are possible by properly combining steps (I) to (K):

First order: step (I)→step (J)→step (K)

Second order: step (J)→step (I)→step (K)

In the first order, an N-type or P-type impurity introduced in step (I) can be activated in step (J). In the second order, it is desired that a separate step of activating the N-type or P-type impurity be provided between steps (I) and (K) or after step (K).

The N-type or P-type impurity may be activated in or after step (J) by irradiating laser light or equivalent intense light. Step (J) may be effected by thermal annealing at 300 to 500° C.

In the invention, the barrier type anodic oxide is generally an anodic oxide produced by gradually increasing the applying voltage in an electrolytic solution that is approximately neutral, and this is dense and has a high breakdown voltage. The porous anodic oxide is an anodic oxide produced by performing its formation and local etching together. In general, it is produced by applying a constant low voltage in an acid electrolytic solution whose hydrogen ion concentration (pH) is smaller than 2.

In particular, while it is difficult to etch the barrier type anodic oxide, the porous type anodic oxide is etched selectively with an etchant such as phosphoric acid. Thus, the porous anodic oxide can be processed without damaging other materials constituting a TFT, such as silicon and silicon oxide. Both of the barrier type and porous type anodic oxides are very resistant to dry etching. In particular, they have a sufficiently large selective etching ratio to silicon oxide in etching.

According to the invention, a semiconductor device producing method comprises the steps of: (a) forming a semiconductor active layer on an insulating surface; (b) selectively providing a doping mask on the semiconductor active layer; (c) forming a silicide forming metal film to cover the semiconductor active layer and the doping mask; (d) selectively introducing an N-type or P-type impurity element into the semiconductor active layer through the metal film; (e) selectively forming a silicide region in the semiconductor active layer by causing the metal film to selectively react with the semiconductor active layer; and (f) removing a portion of the metal film that has not reacted in step (e).

Among the above steps, while the order of steps (a) to (c) cannot be changed, the order of steps (d) to (f) can be changed. The following two processes are possible by properly combining steps (d) to (f):

Third order: step (d)→step (e)→step (f)

Second order: step (e)→step (d)→step (f)

More generally, in the invention, it is necessary that step (c) is performed before steps (d) and (f), and that step (d) is performed before step (e).

In the third order, an N-type or P-type impurity introduced in step (d) can be activated in step (e). In the fourth order, it is desired that a separate step of activating the N-type or P-type impurity is performed between steps (d) and (f) or after step (f).

An N-type or P-type impurity may be activated in or after step (e) by irradiating laser light or equivalent intense light. In step (e), the N-type or P-type impurity may be activated by thermal annealing at 300 to 500° C.

The invention can be applied to both of the bottom gate TFT and the top gate TFT. In particular, in the top gate TFT, the gate electrode and the gate insulating film may be used as the doping mask. In the bottom gate TFT, a mask for doping the source and drain with an impurity may be used as the doping mask.

In step (d), it is preferred that doping be caused to reach a portion of the semiconductor active layer under the doping mask by irradiating ions including an N-type or P-type impurity element to the substrate in a direction that is inclined to the substrate surface by 30° or more.

The silicide structure is produced by forming the anodic oxide film on the gate electrode without forming side walls by anisotropic etching.

After a metal film is formed, the source and the drain are formed by introducing impurity ions into a semiconductor active layer through the metal film. Since a gate insulating film mainly made of silicon oxide is etched with the semiconductor active layer including intrinsic silicon having a large selective etching ratio to silicon oxide or the like, the semiconductor active layer is not overetched. Also, since an N-type or P-type impurity is introduced into a region where silicide is formed, ohmic contact between a silicide region and a metal electrode can be obtained even with a low impurity concentration.

DETAILED DESCRIPTION OF THE PREFERRED EMBODIMENTS

Embodiment 1

Figure 1A:
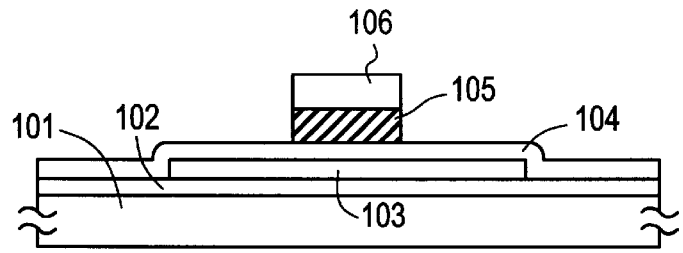
FIGS. 1A to 1G show a TFT producing method of a first embodiment.

The embodiment is described with FIGS. 1A to 1G. A silicon oxide film of 1,000 to 3,000 Å in thickness is formed as a base oxide film 102 on a substrate 101 (Corning 7059; 300 mm×400 mm or 100 mm×100 mm in size). The film 102 may be formed by sputtering in an oxygen atmosphere. To improve the productivity, plasma CVD may be performed using TEOS (tetraethoxysilane).

An amorphous silicon film having a thickness of 300 to 5,000 Å, preferably 500 to 1,000 Å, is deposited by plasma CVD or low pressure CVD (LPCVD), and then crystallized by leaving it for 24 hours in a reducing atmosphere at 550 to 600° C. The crystallization may be effected by laser irradiation. The crystallized silicon film is patterned to form an island-like active layer 103. A silicon oxide film 104 of 700 to 1,500 Å in thickness is formed on the active layer 103 by sputtering.

An aluminum film of 1,000 Å to 3 μm in thickness is formed by electron beam evaporation or sputtering. Aluminum contains Zr (zirconium) of 1 to 5 weight % or Sc (scandium) of 0.1 to 0.3 weight %.

A photoresist (e.g., OFPR800/30cp produced by TOKYO OHKA KOGYO CO., LTD.) is formed on the aluminum film by spin coating. Photosensitive polyimide and ordinary polyimide that can be etched may be used as the photoresist.

If an aluminum oxide film of 100 to 1,000 Å in thickness is formed on a surface of the aluminum film by anodization before forming the photoresist, the adhesiveness between the aluminum film and the photoresist is improved. This is also effective in forming a porous anodic oxide only on the side surfaces in a subsequent anodization, because current leakage through the photoresist can be suppressed.

The photoresist is patterned into a mask 106. By using the mask 106, the aluminum film is etched to form a gate electrode 105. The process goes to the next step leaving the mask 106 as it is. (FIG. 1A)

Figure 1B:
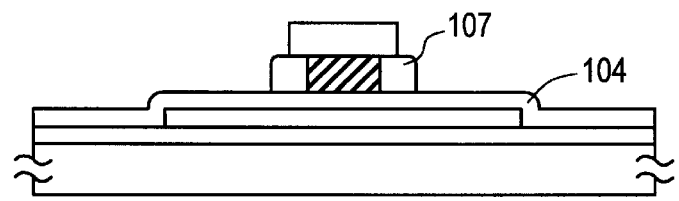

Porous anodic oxides 107 having a thickness of 3,000 to 6,000 Å, e.g., 5,000 Å, are formed on the side surfaces of the gate electrode 105 by causing a current to flow therethrough in an electrolytic solution. This may be performed such that a constant current of 10 to 30 V is applied to the gate electrode 105 in an acid aqueous solution containing 3 to 20% citric acid, nitric acid, phosphoric acid, chromic acid, sulfuric acid, or the like. It is desired that the hydrogen ion concentration (pH) be smaller than 2. The optimum value of pH depends on the kind of electrolytic solution. It is 0.9 to 1.0 in the oxalic acid. In this condition, the porous anodic oxides 107 having a thickness of 0.5 μm or more may be formed by applying a voltage as low as 10 to 30 V. The anodization is performed for 20 to 40 minutes in an oxalic acid solution (pH=0.9 to 1.0; 30° C.) with 10 V. The thickness of the anodic oxides 107 is controlled by the anodization time. (FIG. 1B)

Figure 1C:
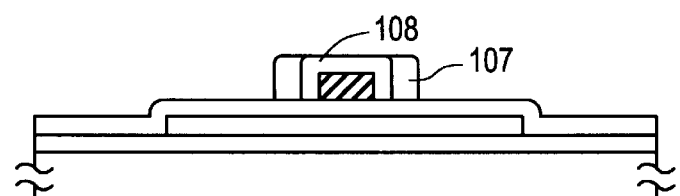

After removing the mask 106, a barrier type anodic oxide 108 is formed on the top and side surfaces of the gate electrode 105 while applying a voltage increased at 1 to 10 V/minute to the gate electrode 105 in an electrolytic solution again. This anodization uses an ethylene glycol ammonia solution (pH=6.9 to 7.1) containing at least one of 3 to 10% tartaric acid, boric acid, and nitric acid. A better oxide film can be obtained when the temperature of the solution is lower than the room temperature, e.g., about 10° C. The thickness of the barrier type anodic oxide 108 depends on the applied voltage. In the applied voltage of 150 V, the barrier type anodic oxide 108 has a thickness of 2,000 Å. (FIG. 1C)

The barrier type anodic oxide 108 is formed between the gate electrode 105 and the porous anodic oxides 107 in spite of the fact that the the barrier type anodic oxide 108 is formed after forming the porous anodic oxides 107.

In a phosphoric acid type etchant, the etching rate of the porous anodic oxides 107 is 10 times or more higher than that of the barrier type anodic oxide 108. Thus, when the porous anodic oxides 107 is later etched with a phosphoric acid type etchant, the gate electrode 105 can be protected by the barrier type anodic oxide 108.

Figure 1D:
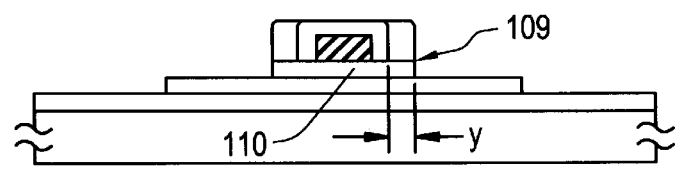

A gate insulating film 110 is formed by etching the silicon oxide film 104 by dry etching. This etching may be either of a plasma mode (isotropic etching) or of a reactive ion etching mode (anisotropic etching). However, it is important to avoid deep etching of the active layer 103 by sufficiently increasing the etching selective ratio of silicon oxide to silicon. Since the active layer 103 is made of intrinsic silicon in this state, it is necessary to use an etching gas having a sufficiently large etching selective ratio of silicon oxide to silicon. If the etching gas is $CF_4$, only the silicon oxide film 104 is etched without etching the anodic oxides 107 and 108. The portion 110 (gate insulating film 110) of the silicon oxide film 104 under the porous anodic oxides 107 remains unetched. (FIG. 1D)

The gate electrode 105 is mainly made of aluminum. When the gate electrode 105 is mainly made of some other material (i.e., tantalum or titanium), the gate insulating film 110 may be formed with silicon oxide and then dry etching may be performed with a fluorine type etching gas (e.g., $NF_3$ or $SF_6$). Since the fluorine type etching gas has a large etching rate to silicon oxide and sufficiently small etching rates to tantalum oxide and titanium oxide, the silicon oxide film 104 can be etched selectively without etching the gate electrode 105. Wet etching may also be performed using an etchant having a large etching selective ratio of silicon oxide to tantalum oxide or titanium oxide. A fluorine type etchant such as 1/100 hydrofluoric acid may be used.

The porous anodic oxides 107 are etched with a mixed acid of phosphoric acid, acetic acid, and nitric acid. In this etching, only the porous anodic oxides 107 are etched and the portion of the gate insulating film 110 under the porous anodic oxides 107 remains. The etching rate is about 600 Å/minute.

Figure 1E:
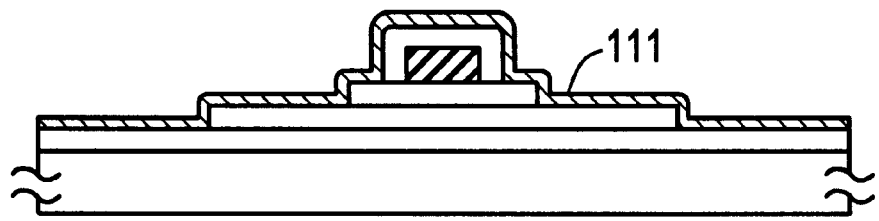

A metal film of titanium, chromium, nickel, molybdenum, tungsten, platinum, palladium etc. is formed over the entire surface of the substrate 101. A titanium film 111 of 200 to 2,000 Å in thickness is formed by sputtering. (FIG. 1E)

Figure 1F:
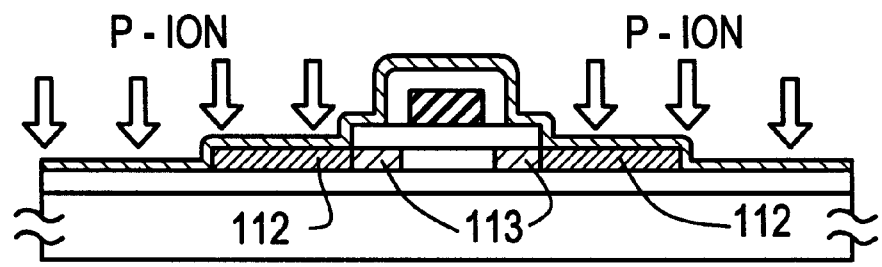

An impurity is introduced into the active layer 103 by ion doping in a self-alignment by using the gate electrode portion (i.e., the gate electrode 105 and the barrier type anodic oxide 108 around it) and the gate insulating film 110 as masks. A phosphorus ion is doped to obtain an N-type conductivity. A doping gas is Phosphine ($PH_3$). The dose is $5 \times 10^{14}$ to $5 \times 10^{15}$ atoms/cm$^2$. The acceleration voltage is 60 to 120 kV. In these conditions, the portion of the active layer 103 under the gate electrode 105 is not doped with impurity ion and kept intrinsic while the other portions are doped with the impurity ion, to form N-type impurity regions. The impurity ion is mainly introduced into the impurity regions 113 under the barrier type anodic oxide 108. Since a large quantity of impurity ions pass through the impurity regions 112, the impurity regions 112 have a lower impurity concentration than the impurity regions 113. To form P-type impurity regions, a doping gas may be diborane ($B_2H_6$). (FIG. 1F)

Although doping is performed only once, it may be performed twice while the voltage is changed, to increase the concentration of impurity ion in the impurity regions 112. The doping may be so performed that the impurity concentration in the impurity regions 112 becomes one to three orders higher than that in the impurity regions 113.

Thermal annealing is performed at 450° C. for 1 to 5 hours. Thus, the doped impurity ion is activated, and the titanium film 111 and silicon of the impurity regions 112 react with each other to form silicide regions 114. Since silicon doped with an impurity has high reactivity, silicide regions can be formed sufficiently even at a temperature as low as 450° C. The impurity regions 113 that are not in contact with the titanium film 111 becomes a source and a drain without forming the silicide regions.

The optical annealing can be performed using an infrared laser such as a Nd:YAG laser (Q switch pulsed oscillation is desired), a visible light laser such as a second harmonic wave of infrared light, or one of various types of ultraviolet light lasers that use excimer such as KrF, XeCl, and ArF. When laser light is irradiated from above the titanium film 111, it is necessary to select laser light having such a wavelength as not to be reflected by the titanium film 111. However, this requirement need not be satisfied if the titanium film 111 is very thin. Laser light may be irradiated from the side of the substrate 101. In this case, it is necessary to use laser light that passes through a silicon semiconductor film existing thereunder.

The annealing may be lamp annealing that irradiates incoherent visible light or near infrared light. In the lamp annealing, the irradiation time is so adjusted that the temperature of the irradiating surface becomes 600 to 1,000° C.: several minutes for 600° C. and several tens of seconds for 1,000° C. The annealing with near infrared light (i.e., infrared light of 1.2 $\mu$m) is very useful because it suppresses to heat the glass substrate. This advantage results from the facts that near infrared light is selectively absorbed by the silicon semiconductor and that each irradiation time can be shortened.

After forming the silicide regions 114, the non-reacted portions of the titanium film 111 is etched with an etching solution obtained by mixing hydrogen peroxide, ammonia, and water at 5:2:2. The portions of the titanium film 111 that are not in contact with the impurity regions 112 (the exposed portion of the active layer 103), i.e., the portions on the gate insulating film 110 and the barrier type anodic oxide 108, which are left at a metal state, are removed by this etching. Since titanium silicide in the silicide regions 114 is not etched, it can be allowed to remain.

A 3,000-Å-thick silicon oxide film as an interlayer insulator 115 is formed over the entire surface by CVD. After contact holes for the source and drain of the TFT are formed, aluminum wiring-electrodes 116 and 117 are formed. Thus, an N-channel type TFT is completed. Highly reliable contacts are obtained because the aluminum wiring-electrodes 116 and 117 contact with the source and drain made of titanium silicide and more stable boundary with aluminum is obtained in comparison with a case of silicon.

Figure 1G:
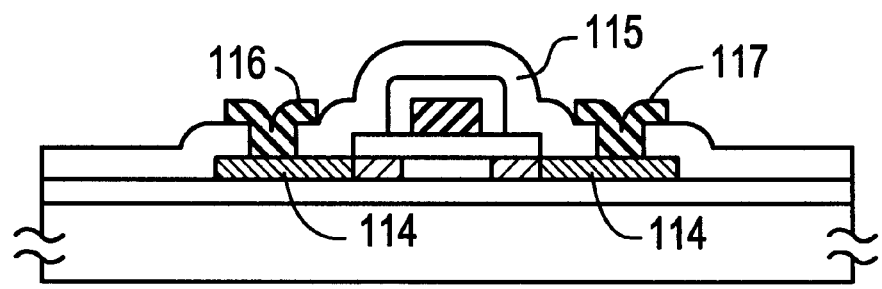

The reliability can further be improved by forming, e.g., a titanium nitride as a barrier metal between the aluminum wiring-electrodes 116 and 117 and the silicide regions 114. The sheet resistance of the silicide regions 114 is 10 to 50 $\Omega/\square$. Thus, the TFT can be produced which has superior frequency characteristics and suffers from less deterioration due to hot carriers even with a high drain voltage. (FIG. 1G)

This embodiment can produce, in a similar manner, P-channel type TFTs and a CMOS circuit.

Embodiment 2

This embodiment is described with FIGS. 3A to 3F. After a base silicon oxide film 302 is deposited on a glass substrate 301, a 500-Å-thick amorphous silicon film is formed thereon by plasma CVD or LPCVD. The amorphous silicon film is crystallized by leaving it for 8 to 24 hours in a reducing atmosphere at 550 to 600° C. A very small amount of catalyst element such as nickel for accelerating crystallization may be added in this crystallization.

The crystallinity of the silicon film is improved by irradiating KrF excimer laser (wavelength: 248 nm). The energy density of the laser depends on the crystallinity of the silicon film. Good results are obtained with an energy density of 200 to 350 mJ/cm$^2$. The optimum energy density also depends on the substrate temperature while the laser irradiation. The obtained crystalline silicon film is etched to form an active layer 303.

A 1,500-Å-thick silicon oxide gate insulating film 304 is formed to cover the active layer 303. Then, a 5,000-Å-thick aluminum film containing Sc of 0.1 to 0.3 weight % is formed by sputtering, and etched to form a gate electrode 305. An anodic oxide 306 is formed on the top and side surfaces of the gate electrode 305 by anodization.

Figure 3A:
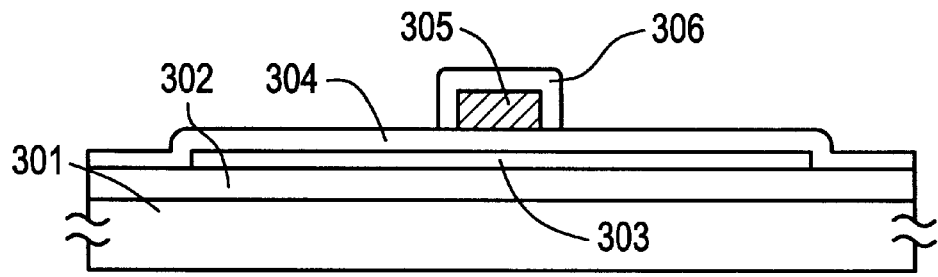
FIGS. 3A to 3F show a TFT producing method of a second embodiment.

The anodization is performed in the following manner. The substrate is immersed in a tartaric acid ethylene glycol solution of 1 to 3% whose pH has been adjusted to be approximately 7 with ammonia. Platinum is used as the cathode and the aluminum gate electrode 305 is used as the anode. The voltage is increased to a particular value while the current is kept constant. This state is kept for 1 hour until completion of the anodization. The thickness of the anodic oxide 306 is 2,000 Å. (FIG. 3A)

Figure 3B:
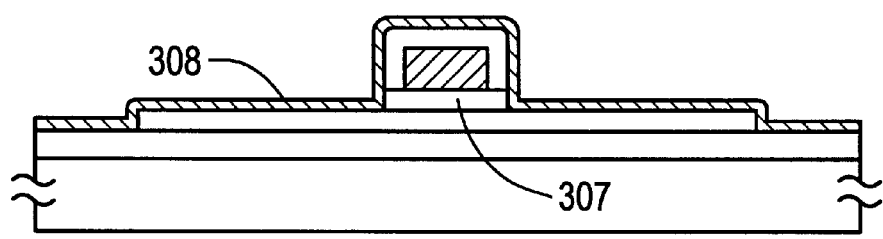

The silicon oxide film 304 is etched using the gate electrode 305 and the anodic oxide 306 as masks by dry etching using an etching gas of CHF$_3$. Dry etching is preferable because only the silicon oxide film 304 is selectively etched, i.e., the anodic oxide 306 made of aluminum oxide is hardly etched. Wet etching may also be performed. The active layer 303 of an N-channel TFT is exposed in this manner. A platinum (Pt) film 308 of 200 to 2,000 Å in thickness is formed by sputtering. (FIG. 3B)

Impurity regions 309 are formed by introducing an impurity ion obliquely. The substrate is rotated while being kept inclined from the direction of an ion source (rotational oblique ion implantation).

Figure 2:
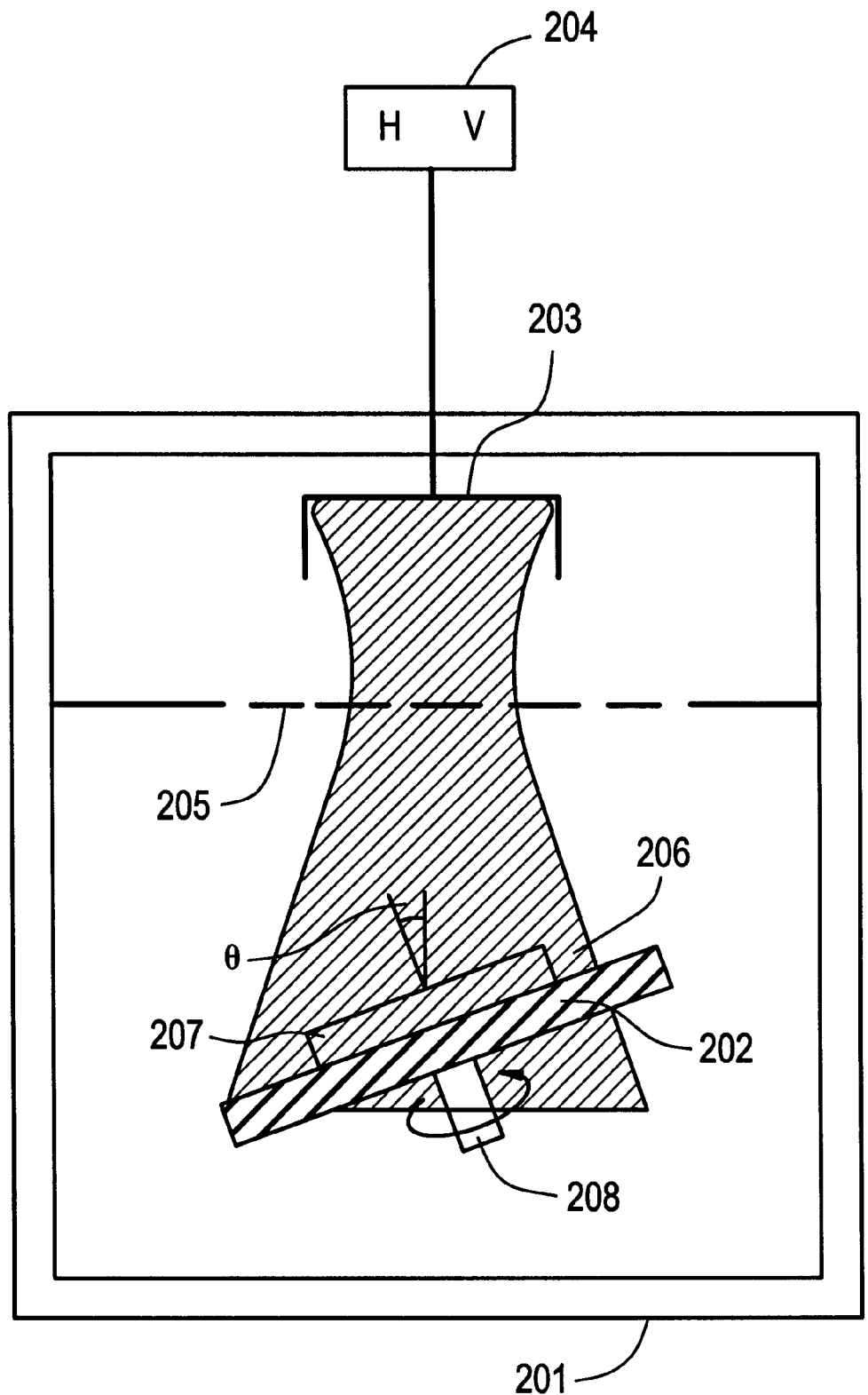
FIG. 2 show a doping apparatus in second to fourth embodiments.

An apparatus of FIG. 2 is used for the rotational oblique ion implantation. This apparatus has a chamber 201, a sample holder (substrate holder) 202 disposed inside the chamber 201, an anode electrode 203, a power supply (HV) 204 for supplying a high voltage to the anode electrode 203, and a grid electrode 205. An angle $\theta$ of the sample holder 202 can be changed freely to allow oblique ion implantation. Also, the sample holder 202 is equipped with a rotary mechanism 208, it can rotate during ion implantation.

The anode electrode has such a structure as allows application of a high voltage. The maximum voltage is 120 kV or higher. An impurity ion 206 ionized by RF discharge or the like, in the vicinity of the grid electrode 205, by the voltage applied to the anode electrode 203, is accelerated toward a substrate (sample) 207 placed on the sample holder 202 and implanted into the substrate 207. In this state, the substrate 207 is rotated while being kept inclined (inclination angle: $\theta$) from the direction of the ion source.

Figure 3C:
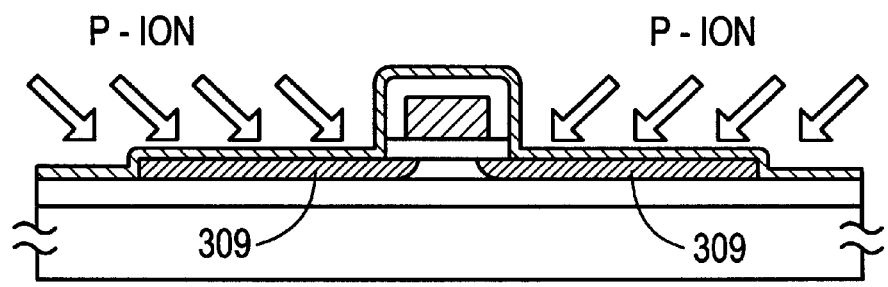

The active layer 303 is doped with a phosphorus ion to obtain N-type conductivity. A doping gas is phosphine (PH$_3$). The dose is $1\times10^{13}$ to $5\times10^{14}$ atoms/cm$^2$ (e.g., $4\times10^{13}$ atoms/cm$^2$) and the acceleration voltage is 60 to 120 kV (e.g., 110 kV). Thus, N-type impurity regions 309 are formed. Because of the rotational oblique ion implantation, the impurity regions 309 extend under the anodic oxide 306, i.e., overlap with the gate electrode 305. (FIG. 3C)

Figure 3D:
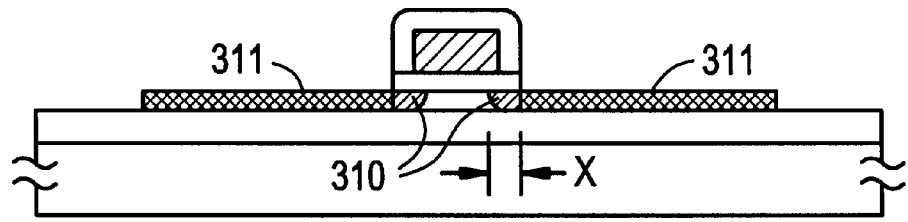

Annealing is performed for 1 hour at 400 to 550° C., e.g., 450° C. Thus, not only silicide regions 311 are formed in the portions of the impurity regions 309 that are in contact with the platinum film 308, but also the doped impurity ion is activated. Since the platinum film 308 does not react with silicon oxide nor aluminum oxide, the portion of the platinum film 308 existing on the silicon oxide film 302 and the anodic oxide 306 is removed. Since this portion of the platinum film 308 has not reacted, it can be removed easily. Thus, the silicide regions 311 are formed in regions corresponding to the source and drain regions. The portions (width: x) of the impurity regions 309 that have not been formed as a silicide region are left as the source and regions 310 under the gate electrode portion. (FIG. 3D)

Figure 3E:
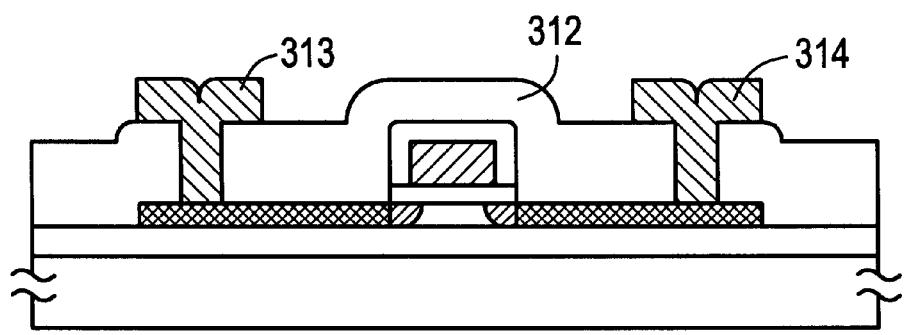

A 3,000-Å-thick silicon oxide film as an interlayer insulator 312 is formed by plasma CVD. Contact holes for the source and drain regions 310 of the TFT are formed by etching the interlayer insulator 312. An aluminum film is formed by sputtering and patterned, i.e., etched to form source and drain electrodes 313 and 314. (FIG. 3E)

Figure 3F:
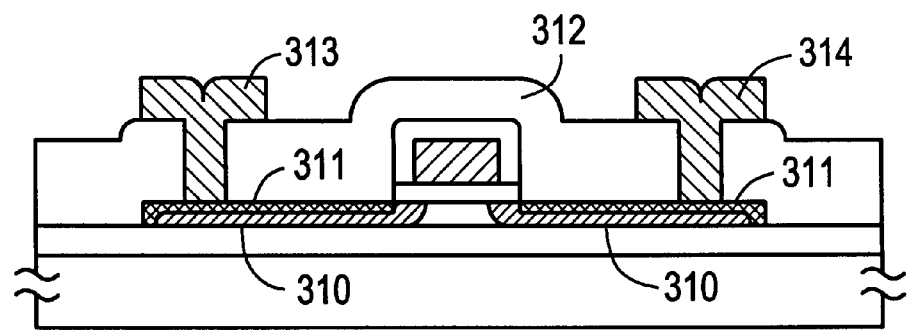

In the above silicide forming process, depending on the way in which the silicide reaction proceeds, a silicide region may be formed to the bottom portion of the active layer 303 (see FIGS. 3D and 3E) or formed only in a surface portion of the active layer 303 (see FIG. 3F). Although naturally the sheet resistance is smaller in the former case, it is sufficiently small even in the latter case. Thus, in either case, the sheet resistance of the source and drain regions is determined almost only by the width x of the impurity regions 310.

The thickness of the silicide regions 311 is selected by the sheet resistance required for the source and drain regions. To obtain a sheet resistance of 10 to 100 $\Omega/\square$, the silicide regions 311 should have a thickness of 100 Å to 1 $\mu$m because the resistivity of silicide is 0.1 to 1 m$\Omega$·cm.

In firming silicide, instead of thermal annealing, intense light such as laser may be irradiated to the metal film to react it with the underlying silicon semiconductor film. Laser light may be irradiated from the side of the substrate 301. A pulsed laser is preferred for the following reasons. That is, a long irradiation time of a continuous oscillation laser may generate heat, which in turn causes an irradiating subject to expand, possibly resulting in its peeling. Also, the substrate may be damaged by heat.

Embodiment 3

Figure 4A:
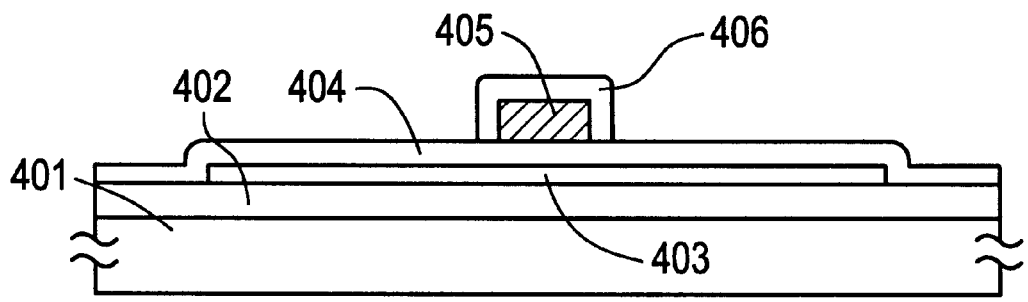
FIGS. 4A to 4F show a TFT producing method of a third embodiment.

This embodiment is described with FIGS. 4A to 4F. A base film 402, an active layer 403, a silicon oxide film 404 serving as a gate insulating film, an anodizable gate electrode 405 are sequentially formed on a glass substrate 401. An anodic oxide 406 is formed on the top and side surfaces of the gate electrode 405 by anodization. (FIG. 4A)

Figure 4B:
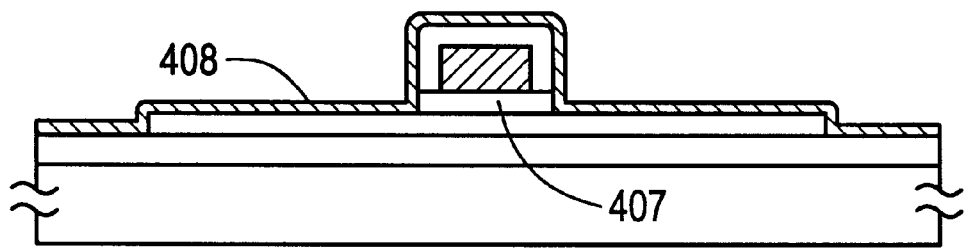

After the silicon oxide film 404 is etched to form a gate insulating film 407, a 1,000-Å-thick palladium film 408 is formed over the entire surface by sputtering. (FIG. 4B)

Figure 4C:
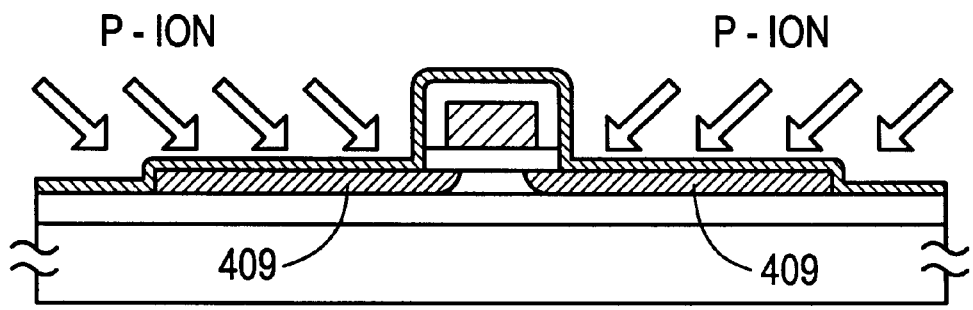

By the rotational oblique ion implantation with the apparatus of FIG. 2, an impurity ion is introduced to the active layer 403 using the gate electrode 405 and the anodic oxide 406 as masks. An phosphorus ion is implanted to obtain N-type conductivity. A doping gas is phosphine ($PH_3$). The dose is lower than the ordinary level, e.g., $1 \times 10^{12}$ to $5 \times 10^{14}$ atoms/cm$^2$. Thus, an impurity ion go under the anodic oxide 406 and low concentration (lightly doped) impurity regions 409 are formed. (FIG. 4C)

Figure 4D:
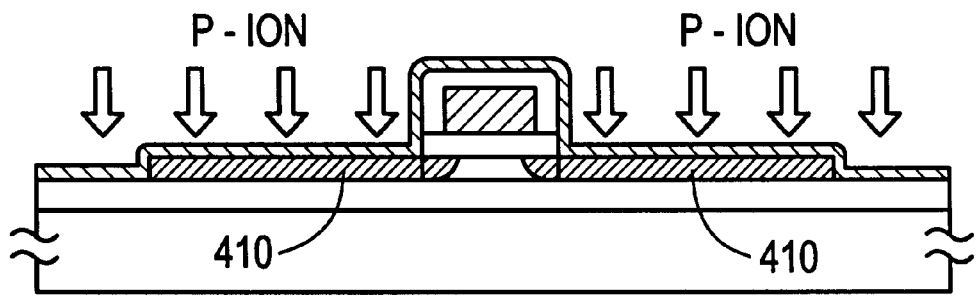

An phosphorus ion is again introduced to the substrate 401 approximately vertically at this time. The dose is higher than in the first implantation; an appropriate dose is $1 \times 10^{14}$ to $5 \times 10^{15}$ atoms/cm$^2$. Thus, the portions (width: x) of the lightly doped impurity regions 409 under the anodic oxide 406 are left while the remaining portions become high concentration (heavily doled) impurity regions 410. (FIG. 4D)

Figure 4E:
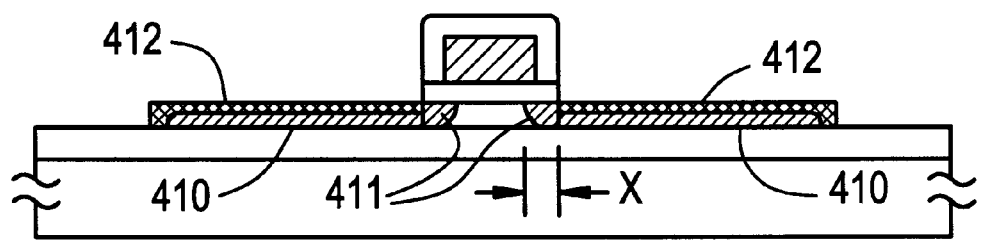

Silicide regions 412 are formed by causing the palladium film 408 to react with the heavily doped impurity regions 410. Since the silicide reaction does not reach the portions of the impurity regions 409 under the anodic oxide 406, those portions become source and drain regions 411 are formed. Since the portion of the palladium film 408 existing on the anodic oxide 406 has hardly reacted, it can be etched easily. This non-reacted portion of the palladium film 408 is removed by etching after completion of the silicide reaction. (FIG. 4E)

Figure 4F:
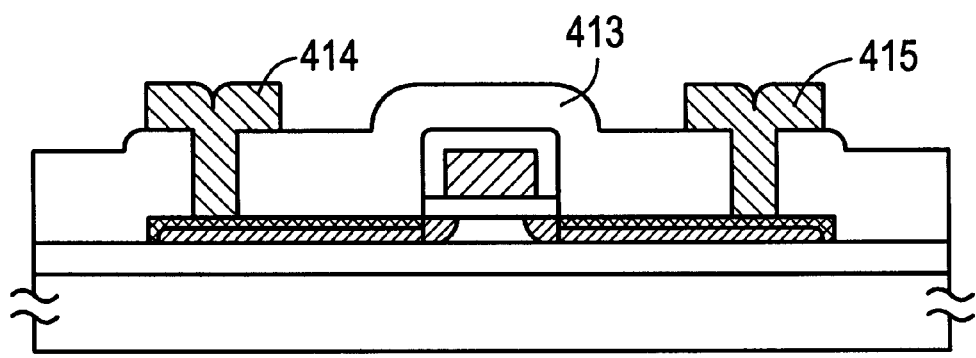

After an interlayer insulator 413 is deposited, contact holes and metal wiring-electrodes 414 and 415 are formed in the silicide regions 412 to complete the TFT. (FIG. 4F)

The source and drain regions 411 are lightly doped with an impurity. When a low concentration impurity is doped in the above manner in an ordinary TFT, an electric field is weakened in the vicinity of the drain, so that degradations due to hot carrier injection as well as source-drain leak current are reduced. When the impurity regions 310 have a low impurity concentration, the NI junction (PI junction in a P-channel type TFT) is shallow due to the low impurity concentration. Further, because of a short distance between the silicide regions 311, a leak current is increased easily when the drain voltage is high. To prevent these problems, it is effective to heavily dope the silicide regions 412 with an impurity as in this embodiment.

Embodiment 4

This embodiment is described with FIGS. 5A to 5F. A gate wiring-electrodes 502 and 503 are formed on a substrate 501 (Corning 7059; 100 mm×100 mm in size). The gate wiring-electrodes 502 and 503 are a 3,000-Å-thick tantalum film. The surface of the gate electrode 503 may be anodized to improve its insulation performance.

Figure 5A:
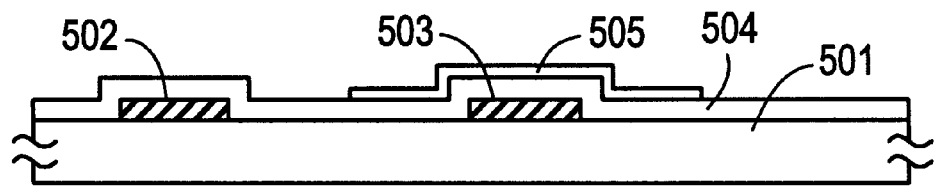
FIGS. 5A to 5F show a TFT producing method a fourth embodiment.

A silicon nitride film 504 having a thickness of 3,000 to 6,000 Å, e.g., 4,000 Å, is deposited by plasma CVD. The silicon nitride film 504 also serves as a gate insulating film. Then, an amorphous silicon film having a thickness of 300 to 1,000 Å, e.g., 500 Å, is formed by plasma CVD, and etched to form an active layer 505. (FIG. 5A)

Figure 5B:
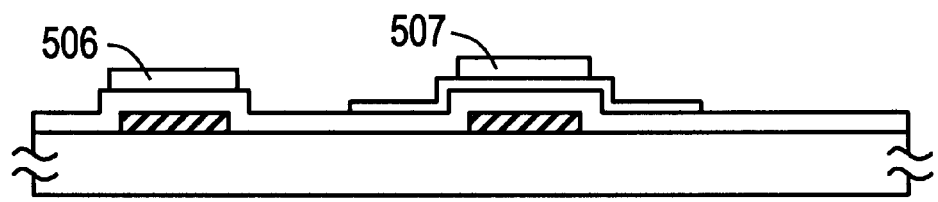

Also, a silicon oxide film having a thickness of 2000 to 6,000 Å, e.g., 2,000 Å, is deposited by plasma CVD. A photoresist is applied over the entire surface. Patterning is performed by light-exposing the substrate from its back side using the gate wiring-electrodes 502 and 503 as masks. The silicon oxide film is etched using the photoresist pattern, to form doping masks 506 and 507. (FIG. 5B)

Figure 5C:
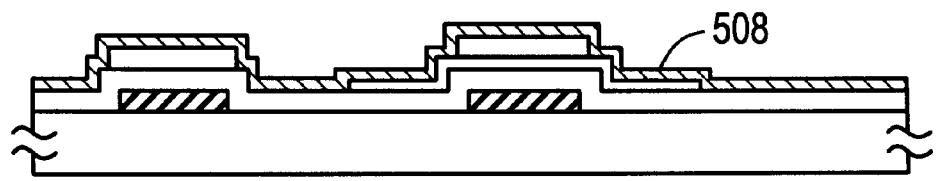

A 500-Å-thick titanium film 508 is formed over the entire surface of the substrate 501 by sputtering. (FIG. 5C).

Figure 5D:
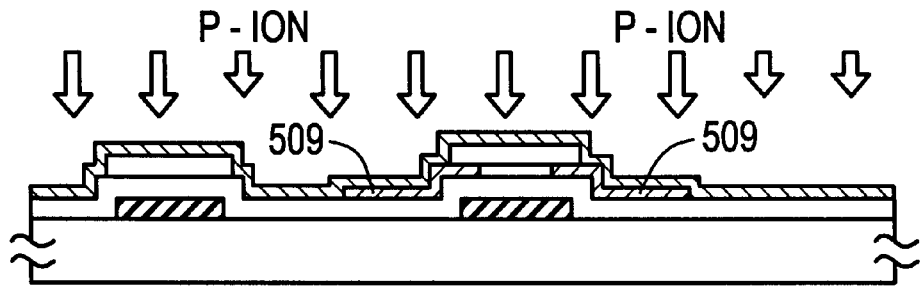

Thereafter, by the rotational oblique ion doping with the apparatus of FIG. 2, an N-type impurity is introduced into the active layer 505 to form N-type impurity regions (source and drain regions) 509. A doping gas is phosphine ($PH_3$). The dose is $5 \times 10^{14}$ to $5 \times 10^{15}$ atoms/cm$^2$ and the acceleration voltage is 60 to 90 kV. (FIG. 5D)

Figure 5E:
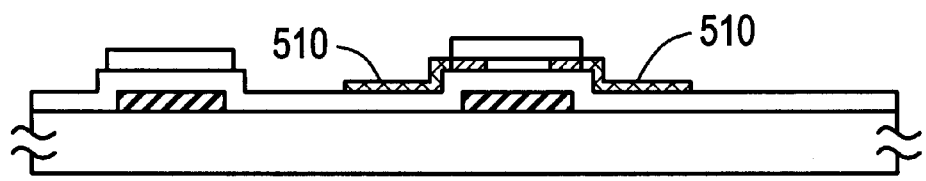

Then, thermal annealing is performed for 10 to 60 minutes at 300 to 450° C., e.g., 350° C., to cause the titanium film 508 to react with silicon of the active layer 505, to form silicide regions 510. The non-reacted portions of the titanium film 508 are etched. (FIG. 5E)

Figure 5F:
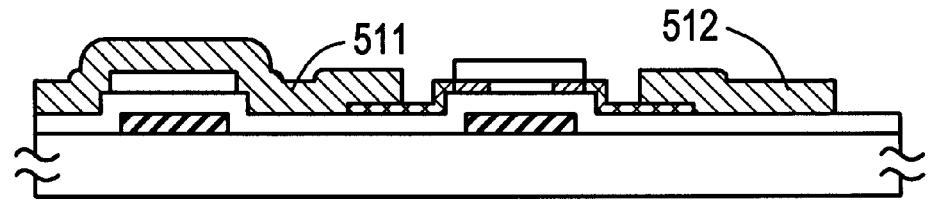
Figure 6A:
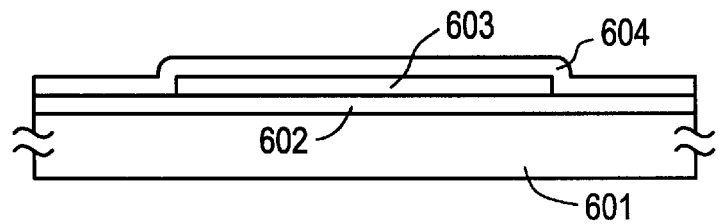
FIGS. 6A to 6G show a conventional TFT producing method.
Figure 6B:
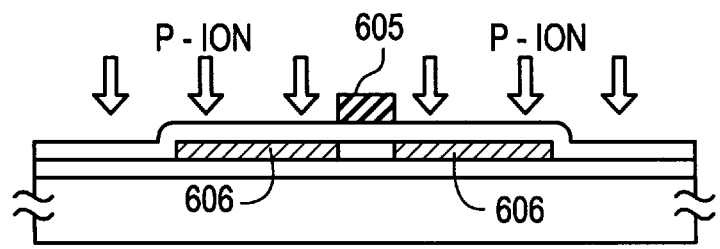
Figure 6C:
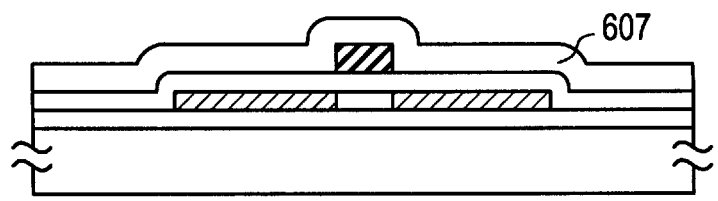
Figure 6D:
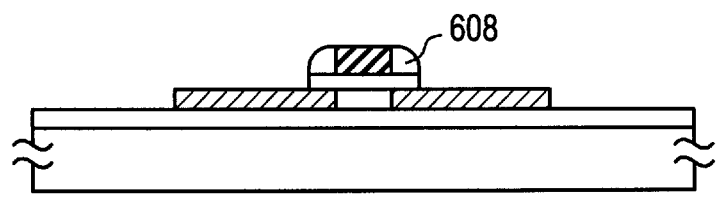
Figure 6E:
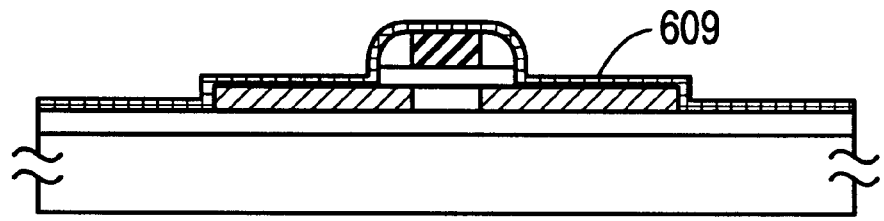
Figure 6F:
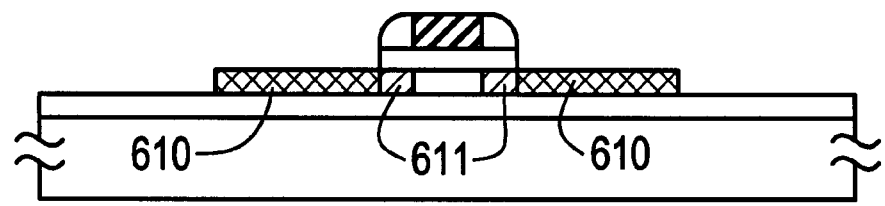
Figure 6G:
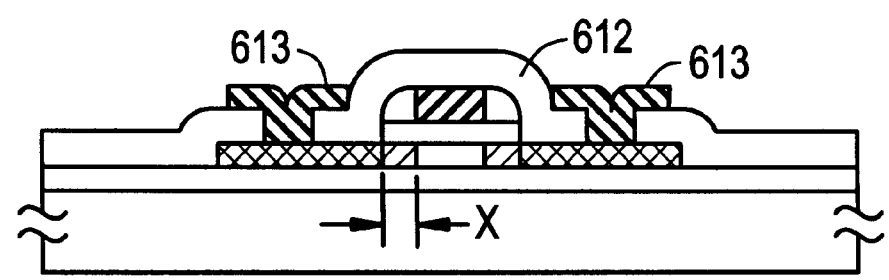

A 5,000-Å-thick aluminum film is formed over the entire surface by sputtering, and etched to form wirings 511 and 512, which contact with the previously formed silicide regions 510. Thus, a TFT is completed. (FIG. 5F)

Embodiment 5

Figure 7A:
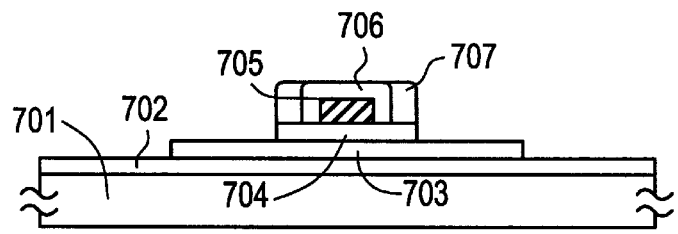
FIGS. 7A to 7E show a TFT producing method of a fifth embodiment.

This embodiment is described with FIGS. 7A to 7E. In the same manner as in Embodiment 1, a base oxide film 702, an active layer 703 of a crystalline silicon film, a gate insulating film 704 of a 1,500-Å-thick silicon oxide, an aluminum (containing Zr (zirconium) of 1 to 5 weight %) gate electrode 705, a barrier type anodic oxide 706, and porous anodic oxides 707 are sequentially formed on a glass substrate 701. (FIG. 7A corresponding to FIG. 1D)

Figure 7B:
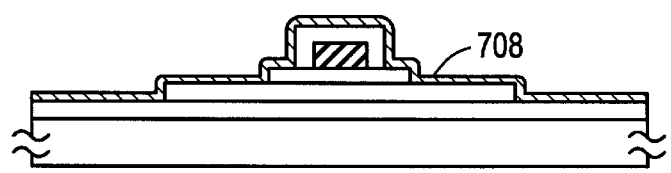

The porous anodic oxides 707 are etched with a mixed acid of phosphoric acid, acetic acid, and nitric acid. Also, a chromium film 708 of 200 to 2,000 Å in thickness is formed over the entire surface by sputtering. At sputtering, chromium reacts with silicon of the active layer 703, to form silicide films (not shown) of 20 to 100 Å in thickness in the surface of the active layer 703. (FIG. 7B)

Figure 7C:
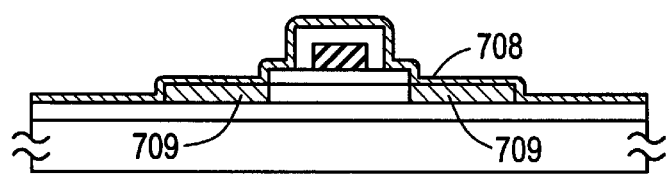

Then, thermal annealing is performed for 1 to 5 hours at 450° C. Thus, the chromium film 708 reacts with silicon of the active layer 703 to form silicide regions 709. Silicide is not formed in the portion of the active layer 703 that is not in contact with the chromium film 708. (FIG. 7C)

The annealing may be optical annealing by using an infrared laser such as a Nd:YAG laser (Q switch pulsed oscillation is desired), a visible light laser such as one that emits a second harmonic wave of infrared light, or one of various types of ultraviolet lasers that use excimers such as KrF, XeCl, and ArF. When laser light is irradiated from above the metal film, it is necessary to select laser light having such a wavelength as not to be reflected by the metal film. But this requirement need not be satisfied if the metal film is very thin. Laser light may be irradiated from the side of the substrate 701. In this case, it is necessary to use laser light that passes through a silicon semiconductor film existing thereunder.

The annealing may be lamp annealing that irradiates incoherent visible light or near infrared light. In the lamp annealing, the irradiation time is so adjusted that the temperature of the irradiation surface becomes 600 to 1,000° C.: several minutes for 600° C. and several tens of seconds for 1,000° C. The annealing with near infrared light (e.g., infrared light of 1.2 $\mu$m) is very useful because it suppresses heating of the glass substrate 701. This advantage results from the facts that near infrared light is selectively absorbed by the silicon semiconductor and that each irradiation time can be shortened.

Figure 7D:
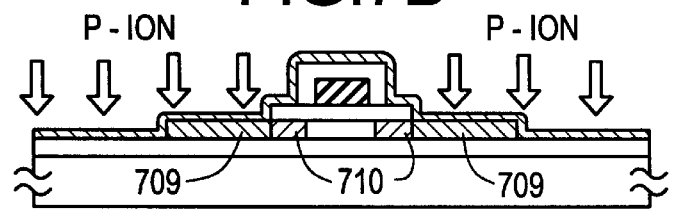

An impurity is introduced into the active layer 703 of the TFT by ion doping in a self-alignment by using the gate electrode portion (i.e., the gate electrode 705 and the anodic oxide film 706 around it) and the gate insulating film 704 as masks. A doping gas is phosphine ($PH_3$). The dose is $5 \times 10^{14}$ to $5 \times 10^{15}$ atoms/cm$^2$ and the acceleration voltage is 60 to 120 kV. Under these conditions, an impurity to be doped are mainly introduced into the portions of the active layer 703 under the gate insulating film 704, to form N-type impurity regions 710. (FIG. 7D)

Although doping is performed only once, doping may be performed twice while the voltage is changed so that the silicide regions 709 are also doped. The doping may be so performed that the impurity concentration in the impurity regions 710 becomes one to three orders lower than that in the silicide regions 709.

The doped impurity is activated by thermal annealing. It is appropriate that the heating temperature be set at 300 to 500° C. and the heating time be set at 0.1 to 2 hours. In the embodiment, annealing is performed for 1 hour at 450° C. The annealing may be performed by using laser light (described above) or by a RTA (rapid thermal annealing) method. Since the activation is performed with the chromium film 708 left as described above, the silicide formation can be promoted.

Figure 7E:
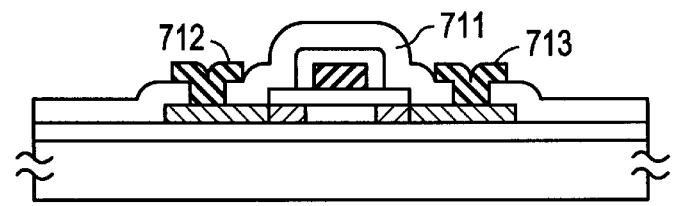

The non-reacted portions of the chromium film 708 are etched, and then a 3,000-Å-thick silicon oxide film as an interlayer insulator 711 is formed over the entire surface by CVD. After contact holes for the source and drain regions of the TFT are formed, aluminum wiring-electrodes 712 and 713 are formed, to complete an N-channel TFT. (FIG. 7E)

Although the doped impurity is activated before removing the chromium film 708, it may be performed after removing the chromium film 708. In the latter case, particularly when laser light or a RTA method is used, activation can be performed effectively because it is not necessary to take into account light reflection by the chromium film 708.

In the invention, after a metal film is formed, the source and drain regions are formed by introducing an impurity ion into a semiconductor active layer through the metal film.

Thus, a gate insulating film mainly made of silicon oxide is etched with the semiconductor active layer in the state of intrinsic silicon having a large selective etching ratio to silicon oxide or the like. As a result, the semiconductor active layer is not overetched, enabling high yield production of TFTs.

Since an N-type or P-type impurity is introduced into regions where silicide is formed, ohmic contact between a silicide region and a metal electrode can be obtained even with a low impurity concentration. Thus, a TFT of the invention exhibits performance equivalent to that of a TFT having the conventional silicide structure.

Since the invention employs anodization, rotational oblique ion implantation or the like, the source and drain regions (regions 113 of FIG. 1F and regions 310 of FIG. 3D) can be so formed that their width is controlled very accurately, which realizes a TFT circuit that is superior in uniformity.

Although the embodiments are mainly directed to a TFT formed on a glass substrate, the TFT of the invention can be formed in similar manners when a three dimensional integrated circuit is formed on a substrate on which a semiconductor integrated circuit has already been formed, and when the TFT is formed on a substrate made of glass, organic resin, or the like. In either case, it is characterized in that the TFT is formed on an insulating surface.

What is claimed is:

1. A method for producing a semiconductor device comprising the steps of:

forming a semiconductor island on an insulating surface;
   selectively forming a gate insulating film on said semiconductor island;
   selectively forming a gate electrode portion on said gate insulating film;
   selectively removing portions of said gate insulating film until a width of said gate insulating film is the same as a width of said gate electrode;
   forming a metal film which covers the semiconductor island, the gate insulating film and the gate electrode portion;
   selectively introducing an N-type or P-type impurity element into the semiconductor island through the metal film in a slanting direction with respect to a major surface of said insulating surface, wherein said gate insulating film with edges of said gate electrode portion to define a width of a source and drain region in said semiconductor island;
   selectively reacting the metal film with the semiconductor island to selectively form a silicide region in the semiconductor island;
   removing a portion of the metal film that has not reacted in the reacting step,
   wherein said slanting direction is an angle of 30° or more with respect to the major surface of the insulating surface.

2. A method according to claim 1 further comprising the step of irradiating laser or intense light corresponding to the intensity of a laser after the reacting step.

3. A method according to claim 1 wherein the reacting step is performed by thermal annealing at 300 to 500° C.

4. A method for producing a semiconductor device comprising the steps of:

forming a semiconductor active layer on an insulating surface;
   selectively forming an insulating film on said semiconductor active layer;

selectively forming a gate electrode portion on said insulating film;

forming a metal film which covers the semiconductor active layer and the gate electrode portion;

selectively reacting the metal film with the semiconductor active layer to selectively form a silicide region in the semiconductor active layer;

removing a portion of the metal film that has not reacted in the reacting step; and selectively introducing an N-type or P-type impurity element into the semiconductor active layer in a slanting direction with respect to a major surface of said insulating surface, wherein the metal film forming step is performed before the reacting step and the introducing step, and the reacting step is performed before the removing step, wherein edges of said insulating film are aligned with edges of said gate electrode portion, wherein said gate electrode portion acts as a mask defining a width of a source and drain region in said semiconductor active layer, wherein said slanting direction is an angle of 30° or more with respect to the major surface of the insulating surface.

5. A method according to claim 4 further comprising the step of irradiating laser or intense light corresponding to the intensity of a laser after the reacting step.

6. A method according to claim 4 wherein the reacting step is performed by thermal annealing at 300 to 500° C.

7. A method for producing a semiconductor device comprising the steps of:

forming a semiconductor island on an insulating surface;

forming a gate insulating film on the semiconductor island, said gate insulating film covering a part of the semiconductor island while the other part of the semiconductor island is exposed;

forming a gate electrode portion on the gate insulating film;

forming a metal film in contact with the other part of the semiconductor island;

introducing an impurity element at a first concentration into the semiconductor island in a slanting direction with respect to a major surface of said insulating surface by using the gate electrode portion and the gate insulating film as masks, so that at least a pair of first impurity portions is formed extending below at least a part of the gate insulating film;

introducing said impurity at a second concentration higher than the first concentration into the semiconductor island after said impurity induction being conducted in a vertical direction with respect to the major surface of said insulating surface so that a pair of second impurity portions is formed in the semiconductor island, wherein edges between each of first and second portions are aligned with edges of the gate electrode portion;

selectively reacting the metal film with the other part of the semiconductor island to selectively form a silicide region in the other part of the semiconductor island; and removing a portion of the metal film that has not reacted in the reacting step, wherein edges of said gate insulating film are aligned with edges of said gate electrode portion, wherein said gate electrode portion acts as a mask defining a width of a source and drain region in said semiconductor island, wherein said slanting direction is an angle of 30° or more with respect to the major surface of the insulating surface.

8. The method of claim 7 further comprising the step of irradiating laser or intense light corresponding to the intensity of a laser after the reacting step.

9. The method of claim 8 wherein the reacting step is performed by thermal annealing at 300 to 500° C.

10. A method according to claim 1 wherein said gate electrode portion includes a gate electrode and an anodic oxide film thereof.

11. A method according to claim 7 wherein said semiconductor island is non-single crystalline.

12. A method according to claim 7 wherein each of the pair of said impurity regions in said semiconductor island has a same width from an edge of the gate electrode.

13. A method according to claim 1 wherein said gate electrode portion, comprises a gate electrode and an anodic oxide film formed thereon.

14. A method according to claim 7 wherein said gate electrode portion comprises a gate electrode and an anodic oxide film formed thereon.

15. A method for producing a semiconductor device comprising the steps of:

forming a semiconductor island on an insulating surface;

selectively forming a gate insulating film on said semiconductor island;

selectively forming a gate electrode portion on said gate insulating film;

forming a metal film which covers the semiconductor island, the gate insulating film and the gate electrode portion;

selectively introducing an N-type or P-type impurity element into the semiconductor island through the metal film in a slanting direction with respect to a major surface of said insulating surface;

selectively reacting the metal film with the semiconductor island to selectively form a silicide region in the semiconductor island;

removing a portion of the metal film that has not reacted in the reacting step, wherein said slanting direction is an angle of 30° or more with respect to the major surface of the insulating surface.

16. A method for producing a semiconductor device comprising the steps of:

forming a semiconductor active layer on an insulating surface;

selectively forming an insulating film on said semiconductor active layer;

selectively forming a gate electrode portion on said insulating film;

forming a metal film which covers the semiconductor active layer and the gate electrode portion;

selectively reacting the metal film with the semiconductor active layer to selectively form a silicide region in the semiconductor active layer;

removing a portion of the metal film that has not reacted in the reacting step; and selectively introducing an N-type or P-type impurity element into the semiconductor active layer in a slanting direction with respect to a major surface of said insulating surface, wherein the metal film forming step is performed before the reacting step and the introducing step, and the reacting step is performed before the removing step, wherein edges of said insulating film are aligned with edges of said gate electrode portion, wherein said slanting direction is an angle of 30° or more with respect to the major surface of the insulating surface.

17. A method for producing a semiconductor device comprising the steps of:

forming a semiconductor island on an insulating surface;

forming a gate insulating film on the semiconductor island, said gate insulating film covering a part of the semiconductor island while the other part of the semiconductor island is exposed;

forming a gate electrode portion on the gate insulating film;

forming a metal film in contact with the other part of the semiconductor island;

introducing an impurity element at a first concentration into the semiconductor island in a slanting direction with respect to a major surface of said insulating surface by using the gate electrode portion and the gate insulating film as masks, so that at least a pair of first impurity portions is formed extending below at least a part of the gate insulating film;

introducing said impurity at a second concentration higher than the first concentration into the semiconductor island after said impurity induction being conducted in a vertical direction with respect to the major surface of said insulating surface so that a pair of second impurity portions is formed in the semiconductor island, wherein edges between each of first and second portions are aligned with edges of the gate electrode portion;

selectively reacting the metal film with the other part of the semiconductor island to selectively form a silicide region in the other part of the semiconductor island; and removing a portion of the metal film that has not reacted in the reacting step, wherein edges of said gate insulating film are aligned with edges of said gate electrode portion, wherein said slanting direction is an angle of 30° or more with respect to the major surface of the insulating surface.

* * * * *